US009063418B2

(12) United States Patent
Kubota (10) Patent No.: US 9,063,418 B2
(45) Date of Patent: Jun. 23, 2015

(54) PHOTOSENSITIVE RESIN COMPOSITION AND PHOTOSENSITIVE PASTE INCLUDING THE SAME

(71) Applicant: MURATA MANUFACTURING CO., LTD., Kyoto-fu (JP)

(72) Inventor: Masahiro Kubota, Kyoto-fu (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 14/300,996

(22) Filed: Jun. 10, 2014

(65) Prior Publication Data

US 2014/0295351 A1    Oct. 2, 2014

Related U.S. Application Data

(63) Continuation of application No. PCT/JP2012/081267, filed on Dec. 3, 2012.

(30) Foreign Application Priority Data

Feb. 27, 2012   (JP) .................................. 2012-040348

(51) Int. Cl.
| | | |
|---|---|---|
| *G03F 7/038* | (2006.01) | |
| *G03F 7/004* | (2006.01) | |
| *G03F 7/032* | (2006.01) | |

(52) U.S. Cl.
CPC ................ *G03F 7/038* (2013.01); *G03F 7/004* (2013.01); *G03F 7/032* (2013.01)

(58) Field of Classification Search
CPC .......... G03F 7/004; G03F 7/032; G03F 7/038
USPC ................................. 430/270.1, 285.1, 286.1
See application file for complete search history.

(56) References Cited

U.S. PATENT DOCUMENTS

| 5,032,478 A * | 7/1991 | Nebe et al. ................. 430/281.1 |
| 6,194,124 B1 * | 2/2001 | Choi et al. ................. 430/287.1 |

(Continued)

FOREIGN PATENT DOCUMENTS

| JP | 2000-103643 A | 4/2000 |
| JP | 2000-243137 A | 9/2000 |

(Continued)

OTHER PUBLICATIONS

Machine translation of JP 2001-278906 (no date).*

(Continued)

*Primary Examiner* — Amanda C Walke
(74) *Attorney, Agent, or Firm* — Studebaker & Brackett PC (57) ABSTRACT

A photosensitive resin composition which is high in thermal decomposition property of a photocured product thereof even in a case of being subjected to heat treatment in a non-oxygen atmosphere and is less likely to generate a residue of carbon and a photosensitive paste composed of the same are provided. The composition contains (a) a photopolymerization initiator, (b) an acryl monomer, and (c) polyalkylene carbonate, in which a ratio of polyalkylene carbonate to a total amount of the acryl monomer and polyalkylene carbonate is not lower than 50 weight % and not higher than 90 weight %. Polypropylene carbonate is used as polyalkylene carbonate. The photosensitive paste is obtained by blending the photosensitive composition, a solvent, and inorganic powders. Insulating inorganic material powders or conductive metal powders are employed as the inorganic powders.

5 Claims, 2 Drawing Sheets

(56) References Cited

U.S. PATENT DOCUMENTS

| | | | |
|---|---|---|---|
| 6,365,265 B1 | 4/2002 | Tose et al. | |
| 6,806,028 B2 * | 10/2004 | Kubota | 430/270.1 |
| 2002/0035194 A1 | 3/2002 | Tose et al. | |
| 2007/0082575 A1 * | 4/2007 | Shin et al. | 445/24 |
| 2009/0008529 A1 * | 1/2009 | Sugimoto et al. | 249/127 |
| 2011/0293896 A1 | 12/2011 | Sugasaki | |

FOREIGN PATENT DOCUMENTS

| | | | |
|---|---|---|---|
| JP | 2000-284472 A | | 10/2000 |
| JP | 2001278906 A | * | 10/2001 |
| JP | 2010-224569 A | | 10/2010 |
| JP | 2011-245752 A | | 12/2011 |
| WO | WO 0173511 A1 | * | 10/2001 |
| WO | 2011/122218 A1 | | 10/2011 |

OTHER PUBLICATIONS

International Search Report; PCT/JP2012/081267; Feb. 19, 2013.
Written Opinion of the International Searching Authority; PCT/JP2012/081267; Feb. 19, 2013.
An Office Action; "Notice of Grounds of Rejection," issued by the Japanese Patent Office on Apr. 28, 2015, which corresponds to Japanese Patent Application No. 2014-501967 and is related to U.S. Appl. No. 14/300,996; with English language translation.

* cited by examiner

PHOTOSENSITIVE RESIN COMPOSITION AND PHOTOSENSITIVE PASTE INCLUDING THE SAME

CROSS REFERENCE TO RELATED APPLICATIONS

This application claims benefit of priority to Japanese Patent Application 2012-040348 filed on Feb. 27, 2012, and to International Patent Application No. PCT/JP2012/081267 filed on Dec. 3, 2012, the entire content of each of which is incorporated herein by reference.

TECHNICAL FIELD

The present technical field relates to a photosensitive resin composition and a photosensitive paste including the same, and specifically to a photosensitive resin composition less likely to generate a residue of carbon during firing and a photosensitive paste including the same.

BACKGROUND

A photosensitive paste has recently widely been used to form a fine pattern on a substrate with photolithography.

A negative photoresist containing (a) a photopolymerization initiator, (b) an acryl monomer, and (c) a main polymer (such as an acryl polymer) has been proposed as one of photosensitive pastes used in such photolithography (see paragraph 0029 of Japanese Patent Laying-Open No. 2010-224569 and the like).

In order to form a fine pattern on a substrate, application of photolithography with the use of a negative photoresist is effective as in Japanese Patent Laying-Open No. 2010-224569. In addition, a negative photoresist in which inorganic powders have been dispersed can also be used.

Then, by using such a photosensitive paste containing inorganic powders, applying photolithography, and performing a firing treatment, a fine inorganic pattern (such as a conductor pattern or an insulator pattern) can efficiently be formed on a substrate.

As described above, however, a photocured product of the negative photoresist in Japanese Patent Laying-Open No. 2010-224569 containing (a) a photopolymerization initiator, (b) an acryl monomer, and (c) a main polymer (such as an acryl polymer) is less likely to thermally be decomposed in heat treatment in a non-oxygen atmosphere.

Therefore, for example, in a case that an electrode is made of a base metal for the purpose of prevention of migration or the like and a paste pattern formed of the photosensitive paste above is subjected to firing treatment in the non-oxygen atmosphere, a residue of carbon (remaining carbon) derived from the photocured product may be generated.

Then, for example, in a case that an insulating layer is to be formed of a photosensitive paste in which glass powders as inorganic powders have been dispersed, insulation reliability becomes poor due to sintering interfered by the residue of carbon.

In addition, in a case that a conductor pattern (an electrode) is to be formed of a photosensitive paste in which copper powders as inorganic powders have been dispersed, conduction becomes poor due to sintering interfered with by the residue of carbon.

SUMMARY

Technical Problem

The present disclosure solves the problems described above and an object thereof is to provide a photosensitive resin composition which is high in thermal decomposition property of a photocured product thereof even in a case of being subjected to heat treatment in a non-oxygen atmosphere and is less likely to generate a residue of carbon and a photosensitive paste such as a photosensitive conductor paste or a photosensitive insulator paste composed of the same.

Solution to Problem

In order to solve the problems above, a photosensitive resin composition according to the present disclosure contains
  (a) a photopolymerization initiator,
  (b) an acryl monomer, and
  (c) polyalkylene carbonate, and is characterized in that
  a ratio of polyalkylene carbonate to a total amount of the acryl monomer and polyalkylene carbonate is not lower than 50 weight % and not higher than 90 weight %.

In the photosensitive resin composition according to the present disclosure, preferably, polyalkylene carbonate is polypropylene carbonate.

The reason why use of polypropylene carbonate as polyalkylene carbonate is preferred is because of high solubility in an organic solvent and less likeliness of a residue during development.

A photosensitive paste according to the present disclosure is characterized by containing the photosensitive resin composition according to the present disclosure above, a solvent, and inorganic powders.

As one preferred form of the photosensitive paste according to the present disclosure, a form containing insulating inorganic material powders as the inorganic powders can be exemplified.

The inorganic powders are preferably at least one type selected from the group consisting of glass powders, quartz powders, alumina powders, and zirconia powders.

By using at least one type selected from the group consisting of glass powders, quartz powders, alumina powders, and zirconia powders, a thick insulating layer high in reliability of bonding to a base material can more reliably be formed.

Alternatively, as another example of a preferred form of the photosensitive paste according to the present disclosure, a form containing conductive metal powders as the inorganic powders can be exemplified.

By containing conductive metal powders as the inorganic powders, use as a photosensitive conductive paste is allowed and a conductive pattern (such as an electrode) high in accuracy and reliability can be formed with photolithography.

Advantageous Effects of Disclosure

Since the photosensitive resin composition according to the present disclosure contains (a) a photopolymerization initiator, (b) an acryl monomer, and (c) polyalkylene carbonate, in which a ratio of polyalkylene carbonate to a total amount of the acryl monomer and polyalkylene carbonate is not lower than 50 weight % and not higher than 90 weight %, generation of a residue of carbon can be suppressed and prevented even in a case that a photocured product after photocuring with photolithography is fired in a non-oxygen atmosphere (such as a nitrogen atmosphere).

Therefore, by using a photosensitive paste obtained by having the photosensitive resin composition according to the present disclosure contain a solvent and inorganic powders (insulating inorganic material powders or a conductive metal powder material such as metal powders), a thick insulating layer high in insulation reliability, a thick conductor layer high in conduction reliability, or the like can be formed.

DETAILED DESCRIPTION

An embodiment of the present disclosure is shown below, for explaining features of the present disclosure in further detail.

A photosensitive resin composition according to the present disclosure is a photosensitive resin composition containing (a) a photopolymerization initiator, (b) an acryl monomer, and (c) polyalkylene carbonate, in which a ratio of polyalkylene carbonate to a total amount of the acryl monomer and polyalkylene carbonate is not lower than 50 weight % and not higher than 90 weight %.

Though a type of a photopolymerization initiator which can be used in the photosensitive resin composition according to the present disclosure is not specially restricted, for example, benzyl, benzoin ethyl ether, benzoin isobutyl ether, benzoin isopropyl ether, benzophenone, benzoyl benzoic acid, benzoylbenzoic acid methyl, 4-benzoyl-4'-methyldiphenyl sulfide, benzyldimethylketal, 2-n-butoxy-4-dimethylamino benzoate, 2-chlorothioxanthone, 2,4-diethylthioxanthone, 2,4-diisopropylthioxanthone, isopropylthioxanthone, 2-dimethylamino ethyl benzoate, p-dimethylamino benzoic acid ethyl, p-dimethylamino benzoic acid isoamyl, 3,3'-dimethyl-4-methoxybenzophenone, 2,4-dimethylthioxanthone, 1-(4-dodecylphenyl)-2-hydroxy-2-methylpropane-1-one, 2,2-dimethoxy-1,2-diphenylethane-1-one, hydroxycyclohexyl phenyl ketone, 2-hydroxy-2-methyl-1-phenylpropane-1-one, 1-[4-(2-hydroxyethoxy)-phenyl]-2-hydroxy-2-methyl-1-propane-1-one, 2-methyl-1-[4-(methylthio)phenyl]-2-morpholinopropane-1-one, methylbenzoyl formate, 1-phenyl-1,2-propanedione-2-(o-ethoxycarbonyl)oxime, 2-benzyl-2-dimethylamino-1-(4-morpholinophenyl)-1-butanone, bis(2,6-dimethoxybenzoyl)-2,4,4-trimethylpentyl phosphine oxide, bis(2,4,6-trimethylbenzoyl)phenyl phosphine oxide, bis(2,4,6-trimethylbenzoyl)-2,4,4-trimethylpentyl phosphine oxide, bis(2,6-dichlorobenzoyl)-2,4,4-trimethylpentyl phosphine oxide, 1-(4-isopropylphenyl)-2-hydroxy-2-methylpropane-1-one, 1,2-diphenylethanedione, methyl phenyl glyoxylate, and the like are exemplified.

Though a type of an acryl monomer which can be used in the photosensitive resin composition according to the present disclosure is not specially restricted either, for example, 2-hydroxyethyl(meth)acrylate, 2-hydroxypropyl(meth)acrylate, 1,4-butanediol mono(meth)acrylate, carbitol(meth)acrylate, acryloylmorpholine, half ester which is a reactant of hydroxyl-group-containing (meth)acrylate (such as 2-hydroxyethyl(meth)acrylate, 2-hydroxypropyl(meth)acrylate, tricyclo[5,2,1,02,6]deca-8-yl-methacrylate, and 1,4-butanediol mono(meth)acrylate) and an acid anhydride of a polycarboxylic acid compound (such as succinic anhydride, maleic anhydride, phthalic anhydride, tetrahydrophthalic anhydride, and hexahydrophthalic anhydride), polyethylene glycol di(meth)acrylate, tripropylene glycol di(meth)acrylate, trimethylolpropane tri(meth)acrylate, trimethylolpropane polyethoxy tri(meth)acrylate, glycerin polypropoxy tri(meth)acrylate, di(meth)acrylate of an ε-caprolactone adduct of neopentyl glycol hydroxypivalate (such as KAYARAD HX-220 and HX-620 manufactured by Nippon Kayaku Co., Ltd.), pentaerythritol tetra(meth)acrylate, poly(meth)acrylate of a reactant of dipentaerythritol and ε-caprolactone, dipentaerythritol poly(meth)acrylate, epoxy(meth)acrylate which is a reactant of a mono- or poly-glycidyl compound (such as butyl glycidyl ether, phenyl glycidyl ether, polyethylene glycol diglycidyl ether, polypropylene glycol diglycidyl ether, 1,6-hexanediol diglycidyl ether, hexahydrophthalic acid diglycidyl ester, glycerin polyglycidyl ether, glycerin polyethoxy glycidyl ether, trimethylolpropane polyglycidyl ether, and trimethylolpropane polyethoxy polyglycidyl ether) and (meth)acrylic acid, a reactant of 3,9-bis(2-hydroxy-1,1-dimethylethyl)-2,4,8,10-tetraoxaspiro[5.5]undecane, 2-(2-hydroxy-1,1-dimethylethyl)-5-ethyl-5-hydroxymethyl-1,3-dioxane, tricyclodecanedimethanol, cyclohexanedimethanol, or the like and (meth)acrylic acid can be exemplified.

Polyalkylene carbonate is a polymer having an alkylene carbonate structure constituted of an alkylene group and a carbonate group. As polyalkylene carbonate which can be used in the photosensitive resin composition according to the present disclosure, for example, alkylene carbonate such as polyethylene carbonate, polypropylene carbonate, poly(1,2-dimethyl ethylene carbonate), polybutene carbonate, polyisobutene carbonate, polypentene carbonate, polyhexene carbonate, policyclopentene carbonate, polycyclohexene carbonate, polycycloheptene carbonate, polycyclooctene carbonate, and polylimonene carbonate, and the like can be exemplified.

Among these, polypropylene carbonate is further preferred.

The photosensitive paste according to the present disclosure contains the photosensitive resin composition according to the present disclosure described above, a solvent, and inorganic powders.

As the inorganic powders, insulating inorganic material powders or conductive metal powders can be used.

As the insulating inorganic material powders, at least one type selected from among glass powders, quartz powders, alumina powders, zirconia powders, and the like can be employed as inorganic powders.

As the conductive metal powders, conductive powders of a base metal such as copper, aluminum, nickel, iron, molybdenum, or tungsten can preferably be employed.

It is noted that conductive powders of a noble metal such as silver, gold, platinum, or palladium can also be used.

Since polyalkylene carbonate is employed as a main polymer in the photosensitive resin composition according to the present disclosure, a thermal decomposition property of a photocured product of a negative photoresist becomes high also in a non-oxygen atmosphere. This is because polyalkylene carbonate is a self-degradable polymer and it decomposes to carbon dioxide and glycol when a temperature is 300° C. or higher even in an $N_2$ atmosphere. Therefore, even though the photosensitive paste including polyalkylene carbonate as a main polymer is subjected to firing treatment in a non-oxygen atmosphere, generation of a residue of carbon derived from the photocured product can be suppressed and prevented.

It is noted that, in the photosensitive resin composition according to the present disclosure, a ratio of polyalkylene carbonate to a total amount of an acryl monomer and polyalkylene carbonate should be not lower than 50 weight % and not higher than 90 weight %. This is because, when a ratio of polyalkylene carbonate is lower than 50 weight %, a ratio of an acryl monomer cured product poor in decomposition property is high and the photocured product does not completely decompose, and alternatively, when the ratio exceeds 90 weight %, resistance to a developer of the photocured product becomes poor because polyalkylene carbonate is not photocured and optimal resolution can no longer be obtained.

It is noted that a more preferred range of a ratio of polyalkylene carbonate to a total amount of an acryl monomer and polyalkylene carbonate is from 60 weight % to 80 weight %.

EXAMPLE 1

(1) Fabrication of Photosensitive Paste

In order to manufacture a photosensitive paste meeting the requirements of the present disclosure and a photosensitive paste for comparison not meeting the requirements of the present disclosure, materials below were prepared.

A. Photopolymerization Initiator

Two types of photopolymerization initiators of a photopolymerization initiator a and a photopolymerization initiator b below were prepared as photopolymerization initiators.

1) Initiator a: 2-methyl-1-[4-(methylthio)phenyl]-2-morpholinopropane-1-one
2) Initiator b: 2,4-diethylthioxanthone B. Acryl Monomer Ethoxy-modified trimethylolpropane triacrylate was prepared as an acryl monomer.

C. Main Polymer

In this Example, an acryl polymer below and polyalkylene carbonate were prepared as main polymers.

1) Acryl polymer: An ethylenic unsaturated double-bond-containing acryl-based copolymer obtained by copolymerization of methacrylic acid/methyl methacrylate and following addition reaction with epoxycyclohexyl methyl methacrylate in a molar quantity 0.2 time as large as methacrylic acid. $M_w$=20000, acid value=118.

2) Polyalkylene carbonate: Polypropylene carbonate $M_w$=302000, purity=97%.

D. Organic Solvent

An organic solvent a and an organic solvent b below were prepared as organic solvents.

1) Organic solvent a: Dipropyleneglycol monomethylether
2) Organic solvent b: N-methyl-2-pyrrolidone E. Glass Powders and Quartz Powders The following were prepared as glass powders and quartz powders.

1) Glass powders: $SiO_2$ (79 weight %)-$B_2O_3$ (19 weight %)-$K_2O$ (2 weight %), $D_{50}$: 3.0 μm
2) Quartz powders: $D_{50}$: 3.0 μm
3) Silica glass powders: Silica glass powders obtained by melting crystal quartz powders in an electric melting furnace at a temperature not lower than a melting point of a cristobalite phase, cooling and vitrifying the melt, and thereafter crushing the product on a pot rack. $D_{50}$ particle size=2.8 μm.

F. Cu Powders

Powders of copper representing a base metal (Cu powders) were prepared as conductive metal powders. In this Example, spherical Cu powders having an oxygen content of 1.2 weight % and a $D_{50}$ particle size of 3 μm were used.

(a) Fabrication of Photosensitive Resin Composition (Varnish)

The materials described above were formulated at a ratio as shown in Table 1 to thereby fabricate photosensitive resin compositions (varnishes) 1 to 6.

It is noted that photosensitive resin composition 4 in Table 1 is a sample in which no polyalkylene carbonate has been blended (with an ethylenic unsaturated double-bond-containing acryl-based copolymer being used as an acryl polymer), photosensitive resin composition 5 in Table 1 is a sample in which a ratio of polyalkylene carbonate (polypropylene carbonate) to a total amount of an acryl monomer and polyalkylene carbonate is 40 weight %, and photosensitive resin composition 6 in Table 1 is a sample in which a ratio of polyalkylene carbonate (polypropylene carbonate) is 95 weight %, each of which does not meet the requirements of the present disclosure.

TABLE 1

| Component | Photosensitive Resin Composition 1 (Part by Weight) | Photosensitive Resin Composition 2 (Part by Weight) | Photosensitive Resin Composition 3 (Part by Weight) | Photosensitive Resin Composition 4 (Part by Weight) | Photosensitive Resin Composition 5 (Part by Weight) | Photosensitive Resin Composition 6 (Part by Weight) |
|---|---|---|---|---|---|---|
| Initiator a | 1.2 | 2.0 | 0.4 | 2.0 | 2.4 | 0.2 |
| Initiator b | 0.6 | 1.0 | 0.2 | 1.0 | 1.2 | 0.1 |
| Monomer | 15.6 | 26.0 | 5.2 | 26.0 | 31.2 | 2.6 |
| Acryl Polymer | — | — | — | 26.0 | — | — |
| Polyalkylene Carbonate | 36.4 | 26.0 | 46.8 | — | 20.8 | 49.4 |
| Organic Solvent a | — | — | — | 40.0 | — | — |
| Organic Solvent b | 65.0 | 52.0 | 70.0 | — | 45.0 | 75.0 |
| Ratio of Polyalkylene Carbonate (Weight %) | 70.0 | 50.0 | 90.0 | — | 40.0 | 95.0 |

(b) Fabrication of Photosensitive Glass Paste

Photosensitive resin compositions (vanishes) 1 to 6 in Table 1, glass powders, quartz powders, and silica glass powders were formulated at a ratio (unit: part by weight) as shown in Table 2A and mixed and kneaded with a triple roll mill, to thereby fabricate photosensitive glass pastes 1 to 6.

TABLE 2A

| Type of Photo-sensitive Glass Paste | Photosensitive Resin Composition 1 (Part by Weight) | Photosensitive Resin Composition 2 (Part by Weight) | Photosensitive Resin Composition 3 (Part by Weight) | Photosensitive Resin Composition 4 (Part by Weight) | Photosensitive Resin Composition 5 (Part by Weight) | Photosensitive Resin Composition 6 (Part by Weight) | Glass Powders (Part by Weight) | Quartz Powders (Part by Weight) | Silica Glass Powders (Part by Weight) |
|---|---|---|---|---|---|---|---|---|---|
| 1 | 118.8 | — | — | — | — | — | 63.0 | 16.0 | 16.0 |
| 2 | — | 107 | — | — | — | — | 63.0 | 16.0 | 16.0 |
| 3 | — | — | 122.6 | — | — | — | 63.0 | 16.0 | 16.0 |
| 4 | — | — | — | 95 | — | — | 63.0 | 16.0 | 16.0 |
| 5 | — | — | — | — | 100.6 | — | 63.0 | 16.0 | 16.0 |
| 6 | — | — | — | — | — | 127.3 | 63.0 | 16.0 | 16.0 |

(c) Fabrication of Photosensitive Cu Paste

Photosensitive resin compositions (vanishes) 1 to 6 in Table 1 and Cu powders were formulated at a ratio (unit: part by weight) as shown in Table 2B and mixed and kneaded with a triple roll mill, to thereby fabricate photosensitive Cu pastes 1 to 6.

Thereafter, a development treatment with acetone was performed to form a via pattern having a 30-μm diameter on a photosensitive glass paste layer on alumina substrate A. Then, by performing firing for 1 hour at 950° C. in an $N_2$ atmosphere, a glass layer G1 having a 20-μm thickness, in which a via pattern having a 60-μm diameter was formed.

TABLE 2B

| Type of Photosensitive Cu Paste | Photosensitive Resin Composition 1 (Part by Weight) | Photosensitive Resin Composition 2 (Part by Weight) | Photosensitive Resin Composition 3 (Part by Weight) | Photosensitive Resin Composition 4 (Part by Weight) | Photosensitive Resin Composition 5 (Part by Weight) | Photosensitive Resin Composition 6 (Part by Weight) | Copper Powders (Part by Weight) |
|---|---|---|---|---|---|---|---|
| 1 | 118.8 | — | — | — | — | — | 320.0 |
| 2 | — | 107 | — | — | — | — | 320.0 |
| 3 | — | — | 122.6 | — | — | — | 320.0 |
| 4 | — | — | — | 95 | — | — | 320.0 |
| 5 | — | — | — | — | 100.6 | — | 320.0 |
| 6 | — | — | — | — | — | 127.3 | 320.0 |

(2) Fabrication of Chip Coil Including Photosensitive Glass Paste for Glass Layer A chip coil including four Cu interconnection layers and four glass layers was fabricated with a method described below. Description will be given below with reference to FIG. 1.

A. Formation of Cu Interconnection Layer Cu1

Figure 1:
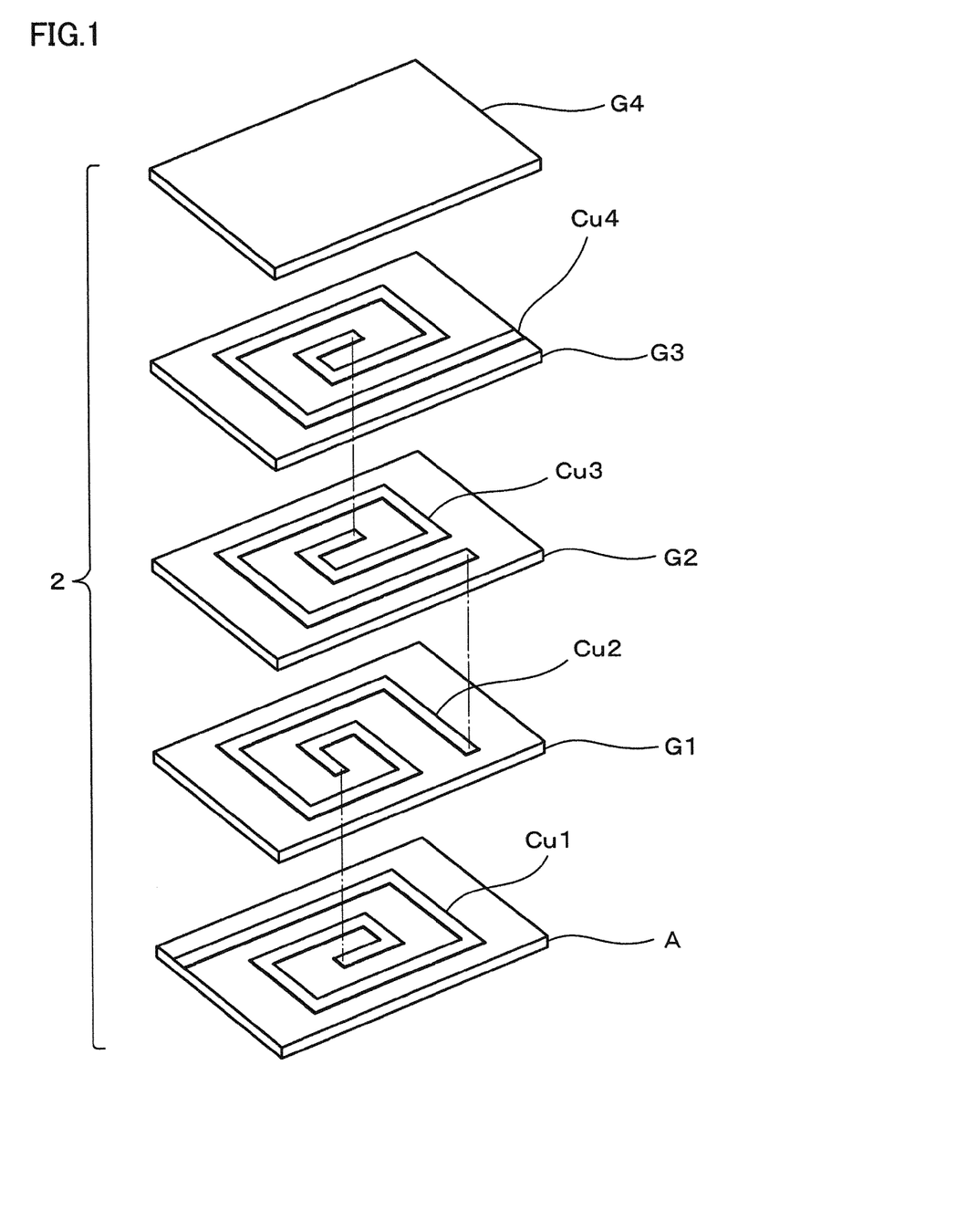
FIG. 1 is an exploded perspective view showing the inside of a chip coil manufactured with a photosensitive paste according to an Example of the present disclosure.

A Cu paste containing Cu powders as a conductive component was separately prepared and this Cu paste was screen-printed, to thereby form a Cu interconnection pattern having a 70-μm width on a surface of an alumina substrate A of 3-inchsq.

Here, a conventional Cu paste obtained by dissolving ethylcellulose in an organic solvent (2,2,4-trimethyl-1,3-pentanediol monoisobutylate) to prepare a vehicle, mixing the vehicle with copper powders to prepare a paste, and thereafter subjecting the paste to a press-through treatment with the use of a mesh was used as the Cu paste.

Then, the Cu paste was baked by holding the same for 10 minutes with a temperature being increased to 950° C. in an $N_2$ atmosphere, to thereby form a Cu interconnection layer Cu1 having a 60-μm width.

B. Formation of Glass Layer G1

Photosensitive glass paste 1 in Table 2A was applied with screen printing to the entire surface of alumina substrate A on which Cu interconnection layer Cu 1 had been formed and dried for 10 minutes at 100° C. Thus, a coating film having a 30-μm thickness was formed and subjected to an exposure treatment.

Here, active light beams from a high-pressure mercury lamp were emitted at an exposure of 100 mJ/cm² through a mask in which a via pattern having a 30-μm diameter was drawn.

C. Formation of Cu Interconnection Layers Cu2 to Cu4, Glass Layers G2 to G4, and External Electrode Initially, a Cu interconnection layer Cu2 was formed on glass layer G1 with the method and conditions the same as those in A. above.

Then, with the method and conditions the same as those in B. above, a glass layer G2 was formed on the entire surface of glass layer G1 on which Cu interconnection layer Cu2 had been formed.

Thereafter, with the methods and conditions the same as those in A. and B. above, a Cu interconnection layer Cu3, a glass layer G3, and a Cu interconnection layer Cu4 were successively formed.

Finally, photosensitive glass paste 1 in Table 2A of the same size as alumina substrate A was applied with screen printing (application over the entire surface) and dried and subjected to exposure of the entire surface with the method and conditions the same as those in B. above, followed by firing. Thus, a glass layer G4 was formed and a stack was obtained.

Then, the obtained stack was cut with a dicer, to thereby obtain a chip coil element assembly for one element.

In addition, a Cu paste for forming an external electrode was applied to opposing ends of the chip coil element assembly such that one end portion of Cu interconnection layer Cu1 and one end portion of Cu interconnection layer Cu4 are connected to each other, and baked at 750° C. in an $N_2$ atmosphere. Thus, external electrodes 3, 4 (FIG. 2) were formed.

Figure 2:
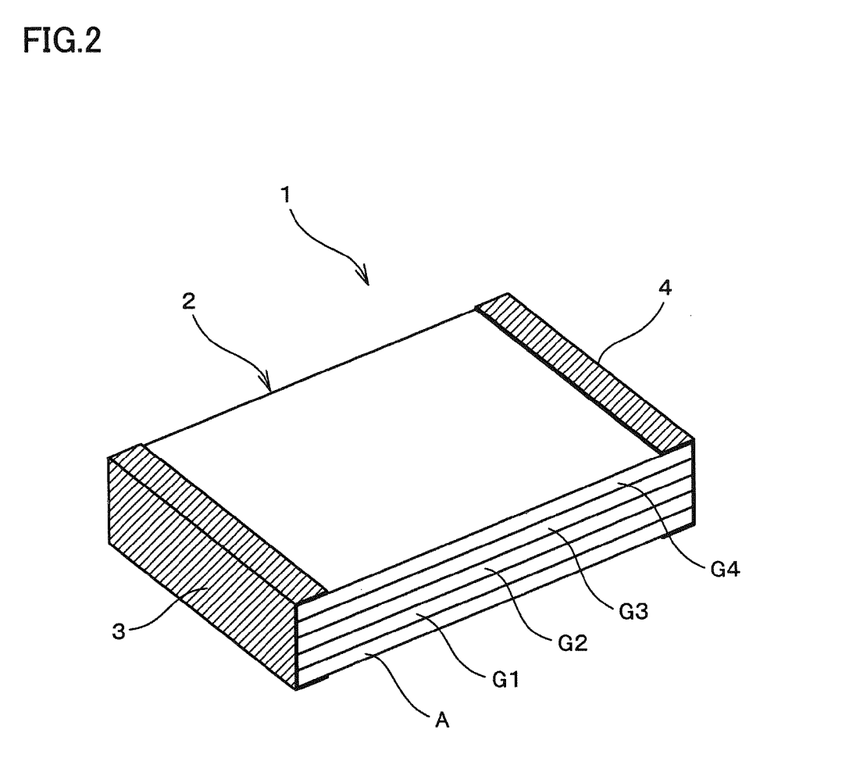
FIG. 2 is a perspective view showing an external construction of the chip coil manufactured with the photosensitive paste according to the Example of the present disclosure.

Thus, as shown in FIG. 2, a chip coil 1 (a sample with a sample number 1 in Table 3), including external electrodes 3 and 4 conducting to one end portion and the other end portion, respectively, of an internal coil at opposing end sides of a chip coil element assembly 2, was obtained.

The chip coil had a size of L=0.6 mm, W=0.3 mm, and T=0.3 mm.

With a similar method, chip coils 1 shown in FIGS. 1 and 2 (samples with sample numbers 2 to 6 in Table 3) were fabricated with the use of photosensitive glass pastes 2 to 6 in Table 2A.

It is noted that, in a sample including photosensitive glass paste 6 in Table 2A (the sample with sample number 6 in Table 3), a coating film of the photosensitive glass paste peeled off in the step of a development treatment in formation of a glass layer and a glass layer could not be formed.

(3) Fabrication of Chip Coil Including Photosensitive Cu Paste for Cu Interconnection Layer A chip coil including four Cu interconnection layers and four glass layers was fabricated with a method described below. Description will be given below with reference to FIG. 1.

A. Formation of Cu Interconnection Layer Cu1

Photosensitive Cu paste 1 in Table 2B was applied with screen printing to the entire surface of alumina substrate A of 3-inch sq. and dried for 10 minutes at 100° C. Thus, a coating film having a 12-μm thickness was formed and subjected to an exposure treatment.

Here, active light beams from a high-pressure mercury lamp were emitted at an exposure of 2000 mJ/cm$^2$ through a mask in which a coil pattern of an interconnection width/an interconnection interval=12/18 μm was drawn.

Thereafter, a development treatment with acetone was performed to form a coil pattern of an interconnection width/an interconnection interval=15 μm/15 μm on alumina substrate A. By performing firing for 1 hour at 950° C. in an $N_2$ atmosphere, a coil pattern of an 8-μm thickness having an interconnection width/an interconnection interval=12/18 μm (Cu interconnection layer Cu1) was obtained.

B. Formation of Glass Layer G1

Photosensitive glass paste 1 in Table 2A was applied with screen printing to the entire surface of alumina substrate A on which Cu interconnection layer Cu 1 had been formed and dried for 10 minutes at 100° C. Thus, a coating film having a 30-μm thickness was formed and subjected to an exposure treatment.

Here, active light beams from a high-pressure mercury lamp were emitted at an exposure of 100 mJ/cm$^2$ through a mask in which a via pattern having a 30-μm diameter was drawn.

Thereafter, a development treatment with acetone was performed to form a via pattern having a 30-μm diameter on a photosensitive glass paste layer on alumina substrate A. Then, by performing firing for 1 hour at 950° C. in an $N_2$ atmosphere, glass layer G1 having a 20-μm thickness in which a via pattern having a 60-μm diameter was formed.

C. Formation of Cu Interconnection Layers Cu2 to Cu4, Glass Layers G2 to G4, and External Electrode Initially, Cu interconnection layer Cu2 was formed on glass layer G1 with photosensitive Cu paste 1 in Table 2B with the method and conditions the same as those in A. above.

Then, with the method and conditions the same as those in B. above, glass layer G2 was formed on the entire surface of glass layer G1 on which Cu interconnection layer Cu2 had been formed.

Thereafter, with the methods and conditions the same as those in A. and B. above, Cu interconnection layer Cu3, glass layer G3, and Cu interconnection layer Cu4 were successively formed.

Finally, photosensitive glass paste 1 in Table 2A of the same size as alumina substrate A was applied with screen printing (application over the entire surface) and dried and subjected to exposure of the entire surface with the method and conditions the same as those in B. above, followed by firing. Thus, glass layer G4 was formed and a stack was obtained.

Then, the obtained stack was cut with a dicer, to thereby obtain a chip coil element assembly for one element.

In addition, a Cu paste for forming an external electrode was applied to opposing ends of the chip coil element assembly such that one end portion of Cu interconnection layer Cu1 and one end portion of Cu interconnection layer Cu4 are connected to each other, and baked at 750° C. in an $N_2$ atmosphere. Thus, external electrodes 3 and 4 (FIG. 2) were formed.

Thus, as shown in FIG. 2, chip coil 1 (a sample with a sample number 7 in Table 3), including external electrodes 3 and 4 conducting to one end portion and the other end portion, respectively, of an internal coil at opposing end sides of chip coil element assembly 2, was obtained.

The chip coil had a size of L=0.6 mm, W=0.3 mm, and T=0.3 mm.

With a similar method, chip coils 1 shown in FIGS. 1 and 2 (samples with sample numbers 8 to 12 in Table 3) were fabricated with the use of photosensitive glass paste 1 in Table 2A and photosensitive Cu pastes 2 to 6 in Table 2B.

It is noted that, in a sample including photosensitive Cu paste 6 in Table 2B (the sample with sample number 12 in Table 3), a coating film of the photosensitive Cu paste peeled off in the step of a development treatment in formation of a Cu interconnection layer and a Cu interconnection layer could not be formed.

(4) Evaluation of Characteristics of Chip Coil

Characteristics of samples (chip coils) with sample numbers 1 to 5 and sample numbers 7 to 11 fabricated as described above were evaluated. It is noted that a glass layer or a Cu interconnection layer could not be formed in chip coils with sample numbers 6 and 12 and hence characteristics could not be evaluated.

An inductance L at 500 MHz of chip coils (n=100) with sample numbers 1 to 5 and sample numbers 7 to 11 fabricated as described above was measured with an impedance analyzer (E4991A manufactured by Agilent Technologies).

In addition, a direct-current resistance Rdc between the external electrodes was measured with a four-terminal method.

Then, a sample in which an inductance value was 70% or lower of an inductance design value (27 nH) was defined as defective in insulation and a ratio of defect (a ratio of defective insulation by a glass layer) was calculated form the count thereof. It is noted that this lowering in inductance is caused by deterioration of a state of insulation by a glass layer.

In addition, a sample in which a direct-current resistance was 130% or higher of a target value (1.5Ω) thereof was defined as defective in conduction and a ratio of defect (a ratio of defective conduction of a Cu interconnection layer) was calculated from the count thereof. It is noted that increase in direct-current resistance value was caused by deterioration of a conduction state of a Cu interconnection layer due to defective sintering owing to a residue of carbon.

Table 3 collectively shows results of measurement of a ratio of defective insulation by a glass layer and a ratio of defective conduction of a Cu interconnection layer.

TABLE 3

| Sample Number | Type of Paste Forming Cu Interconnection Layer | Paste Forming Glass Layer | Peel-Off of Coating Film at the Time of Development | Ratio of Defective Insulation by Glass Layer (%) | Ratio of Defective Conduction of Cu Interconnection Layer (%) |
|---|---|---|---|---|---|
| 1 | Conventional Cu Paste | Glass Paste of Table 2A: 1 | No | 0 | 0 |
| 2 | Conventional Cu Paste | Glass Paste of Table 2A: 2 | No | 0 | 0 |
| 3 | Conventional Cu Paste | Glass Paste of Table 2A: 3 | No | 0 | 0 |
| 4 | Conventional Cu Paste | Glass Paste of Table 2A: 4 | No | 100 | 0 |
| 5 | Conventional Cu Paste | Glass Paste of Table 2A: 5 | No | 20 | 0 |
| 6 | Conventional Cu Paste | Glass Paste of Table 2A: 6 | Yes | — | — |
| 7 | Cu Paste of Table 2B: 1 | Glass Paste of Table 2A: 1 | No | 0 | 0 |
| 8 | Cu Paste of Table 2B: 2 | Glass Paste of Table 2A: 1 | No | 0 | 0 |
| 9 | Cu Paste of Table 2B: 3 | Glass Paste of Table 2A: 1 | No | 0 | 0 |
| 10 | Cu Paste of Table 2B: 4 | Glass Paste of Table 2A: 1 | No | 0 | 100 |
| 11 | Cu Paste of Table 2B: 5 | Glass Paste of Table 2A: 1 | No | 0 | 40 |
| 12 | Cu Paste of Table 2B: 6 | Glass Paste of Table 2A: 1 | Yes | — | — |

The chip coils with sample numbers 4 and 5 in Table 3, in which photosensitive glass pastes 4 and 5 in Table 2A (the photosensitive glass pastes not meeting the requirements of the present disclosure) were used for formation of a glass layer, were high in the ratio of defective insulation by the glass layer.

On the other hand, it was confirmed that the chip coils with sample numbers 1 to 3 in Table 3, in which photosensitive glass pastes 1 to 3 in Table 2A meeting the requirements of the present disclosure were used for formation of a glass layer, were good in a state of sintering of the glass plate to ensure a sufficient insulation property and the glass layer had a good insulating property.

In addition, it was confirmed that defective conduction due to lack of sintering of a Cu interconnection layer was caused, direct-current resistance was high, and a ratio of defective conduction of the Cu interconnection layer was high in the chip coils with sample numbers 10 and 11 in Table 3 in which photosensitive Cu pastes 4 and 5 in Table 2B (the photosensitive pastes not meeting the requirements of the present disclosure) were used for formation of a coil pattern.

On the other hand, it was confirmed that no defective conduction of the Cu interconnection layer was caused in the chip coils with sample numbers 7 to 9 in which the photosensitive Cu pastes meeting the requirements of the present disclosure were used for formation of a coil pattern.

It is noted that, since all chip coils with sample numbers 7 to 11 included photosensitive glass paste 1 in Table 2A meeting the requirements of the present disclosure for formation of a glass layer, the glass layer was confirmed to have a good insulating property.

As described above, it was confirmed that, in a case that a photosensitive paste including polyalkylene carbonate (polypropylene carbonate) as a main polymer, in which a ratio of polyalkylene carbonate to a total amount of an acryl monomer and polyalkylene carbonate was not lower than 50 weight % and not higher than 90 weight %, that is, photosensitive glass pastes 1 to 3 in Table 2A and photosensitive Cu pastes 1 to 3 in Table 2B, was used, even in a case of firing in an $N_2$ atmosphere, a chip coil including a glass layer maintaining insulation reliability (the chip coils with sample numbers 1 to 3 in Table 3) and a chip coil including a Cu interconnection layer good in sintering property and high in conduction reliability (the chip coils with sample numbers 7 to 9 in Table 3) could be obtained.

This is because (1) polyalkylene carbonate high in self-decomposition property is contained by 50 weight % or more in a ratio to a total amount of an acryl monomer and polyalkylene carbonate and therefore a thermal decomposition property of a photocured product is high even in a non-oxygen atmosphere, and consequently, a residue of carbon resulting from the photocured product can be suppressed and prevented even after firing treatment in a non-oxygen atmosphere and (2) a ratio of polyalkylene carbonate high in self-decomposition property to a total amount of an acryl monomer and polyalkylene carbonate is not higher than 90 weight % and therefore resistance to a developer of a photocured product is retained.

Though a case that a photosensitive paste (a photosensitive glass paste and a photosensitive Cu paste) according to the present disclosure was used for manufacturing a chip coil has been described in the Example above, the photosensitive paste according to the present disclosure is applicable to various stack-type electronics such as a multi-layered substrate and a multi-layered LC composite component, without being limited to the chip coil as described above.

The present disclosure is otherwise not limited either to the Example above, and various applications and modifications can be made within the scope of the disclosure with regard to a type of a photopolymerization initiator, an acryl monomer, and polyalkylene carbonate, a ratio of blend thereof, a type of inorganic powders (insulating inorganic material powders or conductive metal powders) to be contained, a ratio of blend thereof, and the like.

The invention claimed is:

1. A photosensitive resin composition, comprising:
   (a) a photopolymerization initiator;
   (b) an acryl monomer; and
   (c) polypropylene carbonate,
   wherein an amount of said polypropylene carbonate is between 50 and 90 weight % of a total amount of said acryl monomer and said polypropylene carbonate.

2. A photosensitive paste, comprising:
   the photosensitive resin composition according to claim 1;
   a solvent; and
   inorganic powders.

3. The photosensitive paste according to claim 2, wherein said inorganic powders are insulating inorganic material powders.

4. The photosensitive paste according to claim 3, wherein said insulating inorganic material powders are at least one type selected from the group consisting of glass powders, quartz powders, alumina powders, and zirconia powders.

5. The photosensitive paste according to claim 2, wherein said inorganic powders are conductive metal powders.

* * * * *